United States Patent [19]

Kuwabara et al.

[11] Patent Number: 5,430,672
[45] Date of Patent: Jul. 4, 1995

[54] DYNAMIC RANDOM ACCESS MEMORY DEVICE HAVING ONE-TRANSISTOR ONE-CAPACITOR TYPE MEMORY CELLS COUPLED BETWEEN BIT LINES PAIRED WITH EACH OTHER

[75] Inventors: Shinichi Kuwabara; Toshio Komuro, both of Tokyo, Japan

[73] Assignee: NEC Corporation, Tokyo, Japan

[21] Appl. No.: 181,468

[22] Filed: Jan. 13, 1994

[30] Foreign Application Priority Data

Jan. 13, 1993 [JP] Japan ................... 5-003718

[51] Int. Cl.$^6$ ........................................... G11C 11/24
[52] U.S. Cl. ........................ 365/149; 365/203; 365/230.02; 365/230.03; 365/230.08; 365/150
[58] Field of Search ............... 365/149, 189.01, 150, 365/189.05, 230.01, 230.02, 230.03, 230.08, 207, 63, 203

[56] References Cited

U.S. PATENT DOCUMENTS 5,272,665 12/1993 Uesugi ................................. 365/207

OTHER PUBLICATIONS

Mikio Asakura et al., "Cell-Plate Line Connecting Complementary Bitline (C$^3$) Architecture for Battery Operating DRAMs", *VLSI Symposium on Circuit,* pp. 59-60.

*Primary Examiner*—Terrell W. Fears
*Attorney, Agent, or Firm*—Sughrue, Mion, Zinn, Macpeak & Seas

[57] ABSTRACT

A dynamic random access memory device has a plurality of one-transistor one-capacitor type memory cells each coupled between a first bit line and a second bit line paired with the first bit line, and parasitic capacitance coupled with the first bit line is approximately equal to a parasitic capacitance coupled with the second bit line so that a large potential difference takes place between the first and second bit lines when the storage capacitor is coupled with the first and second bit lines precharged to an intermediate voltage level.

7 Claims, 6 Drawing Sheets

DYNAMIC RANDOM ACCESS MEMORY DEVICE HAVING ONE-TRANSISTOR ONE-CAPACITOR TYPE MEMORY CELLS COUPLED BETWEEN BIT LINES PAIRED WITH EACH OTHER

FIELD OF THE INVENTION

This invention relates to a dynamic random access memory device and, more particularly, to a one-transistor one-capacitor type memory cell coupled between paired bit lines.

DESCRIPTION OF THE RELATED ART

A dynamic random access memory device memorizes data information in an array of one-transistor one-capacitor type memory cells in the form of electric charge, and the transistors and the capacitors are progressively miniaturized for enhancing the integration density. A step-down power voltage is distributed to the miniaturized memory cells, because the step-down power voltage prevents the storage capacitors from damage. However, the amount of electric charge stored in each cell is decreased together with the miniaturization, and the small amount of electric charge in the storage capacitor only produces small potential difference on an associated bit line pair. For this reason, a sense amplifier circuit coupled with the bit line pair suffers from a small margin between the actual potential difference and the sensible potential difference.

A solution has been proposed by Asakura et al. in "Cell-Plate Line Connecting Complementary Bitline ($C^3$) Architecture for Battery Operating DRAMs", VLSI Symposium on Circuit, pages 59 and 60, and FIG. 1 illustrates the memory cell array disclosed by Asakura et al.

Description is firstly made on the memory cell array. Referring to FIG. 1, a cell plate line CPL extends between bit lines BL1 and BL2 paired with each other, and memory cells MC1 and MC2 are alternately coupled between the bit lines BL1 and BL2 and the cell plate line CPL.

Each of the memory cells MC1 and MC2 is implemented by a series of an n-channel enhancement type switching transistor Qn1 and a storage capacitor Cs1. The drain node of the n-channel enhancement type switching transistor Qn1 is connected with the associated bit line BL1 or BL2, and word lines WL1 and WL2 are selectively connected with the gate electrodes of the n-channel enhancement type switching transistors Qn1 of the memory cells MC1 and MC2. A data bit is stored in an accumulating electrode of the storage capacitor Cs1 in the form of electric charge, and the cell plate line CPL is shared between the counter electrodes of the storage capacitors Cs1.

When the word line WL1 or WL2 goes up to a boosted voltage level Vboot higher than a positive power voltage Vcc by the threshold of the n-channel enhancement type switching transistors Qn1, the n-channel enhancement type switching transistor Qn1 coupled therewith turns on, and the accumulation electrode of the storage capacitor Cs1 is conducted with the associated bit line BL1 or BL2. As a result, the bit line BL1 or BL2 is slightly pulled up or down depending upon the amount of electric charge stored therein, and a small potential difference takes place between the bit lines BL1 and BL2.

A precharge/balance circuit 1 is associated with the cell plate line CPL and the bit lines BL1 and BL2, and is responsive to a precharge control signal PC for balancing the cell plate line CPL and the bit lines BL1 and BL2 at an intermediate voltage level Vm between the positive power voltage level Vcc and the ground voltage level. Namely, the precharge/balance circuit 1 comprises an n-channel enhancement type charging transistor Qn2 coupled between a precharge voltage line Vm and the cell plate line CPL, and n-channel enhancement type switching transistors Qn3 and Qn4 coupled between the cell plate line CPL and the bit lines BL1 and BL2. The precharge control signal PC is applied to the gate electrodes of the n-channel enhancement type switching transistors Qn2 to Qn4, and the cell plate line CPL and the bit lines BL1 and BL2 are charged to the intermediate voltage level Vm.

A sense amplifier circuit 2 is further provided for the bit lines BL1 and BL2, and is responsive to an activation signal SE for developing the small potential difference between the bit lines BL1 and BL2.

The cell plate line CPL is connectable through n-channel enhancement type switching transistors Qn5 and Qn6 with the bit lines BL1 and BL2, and the n-channel enhancement type switching transistors Qn5 and Qn6 are respectively gated by dummy word lines DWL1 and DWL2. The dummy word lines DWL1 and DWL2 are associated with the word lines DWL1 and DWL2, respectively, and are complementarily driven with respect to the associated word lines.

Subsequently, an access to the memory cell MC1 is hereinbelow described with reference to FIG. 2 of the drawings. The precharge control signal PC remains in the power voltage level Vcc before the access, and the bit lines BL1 and BL2 and the cell plate line CPL are balanced at the intermediate voltage level Vm.

If the row address bits are changed to the address assigned to the word line WL1, the precharge control signal PC goes down to the ground voltage level at time t1, and the bit lines and the cell plate line CPL are electrically isolated from one another.

A row address decoder/word line driver (not shown) lifts the word line WL1 toward the boosted voltage level Vboot at time t2, and the dummy word line DWL2 simultaneously goes up to the boosted voltage level, leaving the other dummy word line DWL1 at the ground voltage level. As a result, the n-channel enhancement type switching transistor Qn1 of the memory cell MC1 conducts the accumulation electrode N1 of the storage capacitor Cs1 with the bit line BL1, and the n-channel enhancement type switching transistor Qn6 conducts the cell plate line CPL with the other bit line BL2.

The accumulating electrode N1 and the bit line BL1 slightly go down a voltage level Vx, and the bit line BL1 slightly goes up to the voltage level Vx. The other bit line BL2 goes down to a voltage level Vy. As a result, a potential difference dV takes place between the bit lines BL1 and BL2, and the potential difference dV is calculated as follows.

The accumulating electrode N1 is assumed to be charged to Vc, and Cb, Cc and Cs are indicative of the parasitic capacitance of each bit line BL1 or BL2, the parasitic capacitance of the cell plate line CPL and the capacitance of the storage capacitor Cs1. In the access to the memory cell MC1 shown in FIG. 2, Vs is equal to Vcc. Equations 1 and 2 are established therebetween.

$$Cb(Vm) + Cs(Vc - Vm) = Cb \times Vx + Cs(Vx - Vy) \qquad \text{Equation 1}$$

$$(Cb-Cc)Vm+Cs(Vm-Vc)=(Cb+Cc)Vy+Cs(Vy-Vx)$$ Equation 2

From Equations 1 and 2, the potential difference dV is given by Equation 3.

$$dV = Vx - Vy = (Vc - Vm)/[1 + A(1 + B)]$$
$$= (Vc - Vm)/[\{A(1 + B)/(1 + 2B)\} + 1]$$ Equation 3 where A is Cb/Cs and B is Cb/Cc.

If A, B, Vs and Vm are 10, 3, Vcc and Vcc/2, dV is 0.07 Vcc. The dynamic random access memory device is usually powered with Vcc, and Vm is Vcc/2 in standard dynamic random access memory devices.

The activation signal SE goes up toward the high voltage level at time t4, and the sense amplifier circuit 2 starts developing the small potential difference dV between the bit lines BL1 and BL2. The sense amplifier circuit 2 changes the bit lines BL1 and BL2 to the positive power voltage level Vcc and the ground voltage level, and the memory cell MC1 restores the data bit represented by the positive power voltage level again.

If the dummy word line system, i.e., the dummy word lines DWL1/ DWL2 and the n-channel enhancement type switching transistors Qn5/Qn6 are not incorporated in the prior art dynamic random access memory device, the cell plate line CPL is maintained at the ground voltage level, and B is zero. For this reason, the potential difference dV' between the bit lines BL1 and BL2 is given as $$dV'=(Vs-Vm)/(1+A)$$ Equation 4

The ratio R between dV and dV' is calculated as $$R = (1 + A)/[\{A(1 + B)/(1 + 2B)\} + 1] > 1$$ Equation 5

Thus, the dummy word line system effectively increases the initial potential difference between the bit lines BL1 and BL2. However, dynamic random access memory devices of the next generation is fabricated from further miniaturized circuit components, and the prior art dummy word line system can not guarantee a large margin for the sense amplifier circuits.

Moreover, the prior art dummy word line system requires the dummy word lines DWL1 and DWL2 and the cell plate line CPL, and another problem inherent in the prior art dynamic random access memory device is the complex circuit arrangement due to the dummy word lines DWL1 and DWL2 and the cell plate lines.

SUMMARY OF THE INVENTION

It is therefore an important object of the present invention to provide a dynamic random access memory device which is free from the problem inherent in the prior art dynamic random access memory device.

To accomplish the object, the present invention proposes to cause a storage capacitor to directly drive paired bit lines.

In accordance with the present invention, there is provided a dynamic random access memory device comprising: a) a memory cell array including a plurality of addressable memory cells having respective switching transistors and respective storage capacitors respectively connected in series with the switching transistors; b) a plurality of word lines selectively connected with control gates of the switching transistors for selecting memory cells from the memory cell array; c) a plurality of bit line pairs selectively coupled with the plurality of addressable memory cells for producing potential differences indicative of data bits read out from the memory cells selected from the memory cell array, each of the plurality of bit line pairs consisting of a first bit line and a second bit line, memory cells associated with each bit line pair being grouped into a first memory cell block and a second memory cell block, the switching transistors and the associated storage capacitors of the first memory cell block being connected with the first bit line and the second bit line of the associated bit line pair, respectively, the switching transistors and the associated storage capacitors of the second memory cell block being connected with the second bit line and the first bit line of the associated bit line pair, respectively; and d) a read/write system associated with the plurality of bit line pairs, and operative to read and write at least one data bit from and into the memory cell array.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 3:
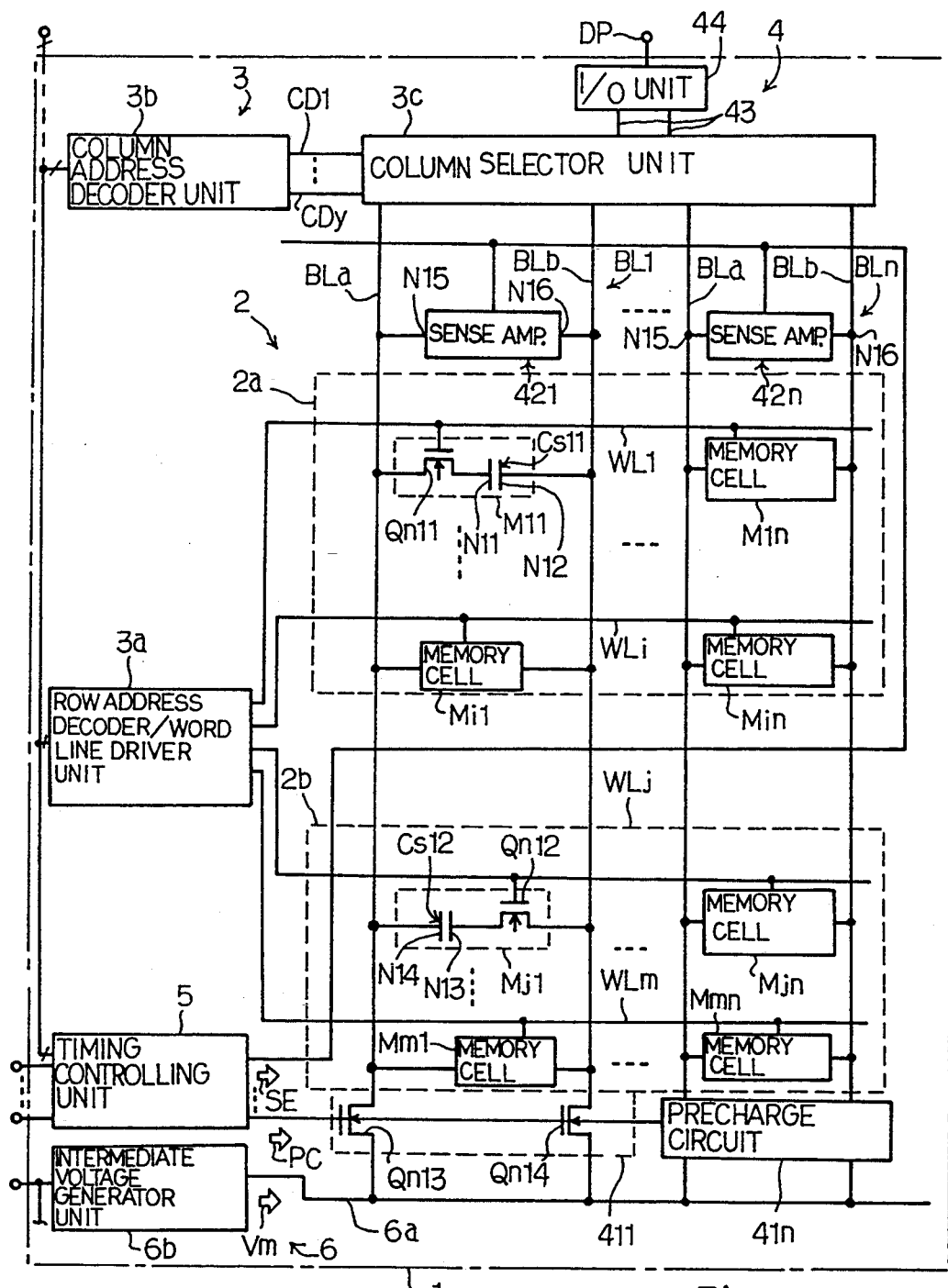
FIG. 3 is a circuit diagram showing the arrangement of a dynamic random access memory device according to the present invention.

Referring to FIG. 3 of the drawings, a dynamic random access memory device embodying the present invention is fabricated on a semiconductor chip 1, and largely comprises a memory cell array 2, an addressing system 3, a read/write system 4, a timing controlling unit 5 and a power supply system 6. Although another system such as an autorefreshing system is further incorporated in the dynamic random access memory device, they are not shown in the drawings for the sake of simplicity.

The memory cell array 2 consists of a plurality of addressable memory cells M11 to M1n, . . . , Mi1 to Min, Mj1 to Mjn, . . . and Mm1 to Mmn, and the plurality of memory cells M11 to Mmn are arranged in rows and columns. The rows of memory cells M11 to Mmn are broken down into two memory cell sub-array 2a and 2b, and the rows M11 to M1n, . . . and Mi1 to Min and the rows Mj1 to Mjn, . . . and Mm1 to Mmn respectively form the two memory cell sub-arrays 2a and 2b. In this instance, the memory cells M11 to Mil or M1n to Min form a first memory cell block, and the memory cells Mj1 to Mm1 or Mjn to Mmn form a second memory cell block.

Each of the memory cells M11 to Min of the memory cell sub-array 2a is implemented by a series combination of an n-channel enhancement type switching transistor Qn11 and a storage capacitor Cs11, and the storage capacitor Cs1 has an accumulating electrode N11 and a counter electrode N12. A data bit is stored in the storage capacitor Cs11 in the form of electric charge, and the logic level of the stored data bit is depending upon the amount of electric charge. The electric charge stored in each memory cell is hereinbelow referred to as a charge packet.

Similarly, each of the memory cells Mj1 to Mmn of the memory cell sub-array 2b is implemented by a series combination of an n-channel enhancement type switching transistor Qn12 and a storage capacitor Cs12, and the storage capacitor Cs12 has an accumulating electrode N13 and a counter electrode N14. A data bit is also stored in the storage capacitor Cs11 in the form of charge packet. The n-channel enhancement type switching transistor Qn12 and the storage capacitor Cs12 are identical with the n-channel enhancement type switching transistor Qn11 and the storage capacitor Cs11, respectively.

Row addresses are respectively assigned to the rows of memory cells M11 to M1n, . . . and Mm1 to Mmn, and column addresses are assigned to the columns of memory cells M11 to Mm1, . . . and M1n to Mmn, respectively. For this reason, the addressing system 2 can select each memory cell from the memory cell array 2 with the row and column addresses.

The addressing system 2 comprises a row address decoder/word line driver unit 3a, a plurality of word lines WL1, . . . , WLi, WLj, . . . and WLm, a column address decoder unit 3b, a column selector unit 3c and bit line pairs BL1 to BLn. The plurality of word lines WL1 to WLm are associated with the rows of memory cells M11 to M1n, . . . and Mm1 to Mmn, and, accordingly, each of the word lines WL1 to WLm is identified by using the row address assigned to the associated row of memory cells. Each of the word lines WL1 to WLm is coupled with the gate electrodes of the n-channel enhancement type switching transistors Qn11 or Qn12 in the associated row, and in turn is coupled with the row address decoder/word line driver unit 3a.

The row address decoder/word line driver unit 3a is responsive to the row address predecoded signals indicative of one of the row addresses, and drives one of the word lines WL1 to WLm assigned the selected row address. While the row address decoder/word line driver unit 3a drives a selected word line to boosted voltage level Vboot, the n-channel enhancement type switching transistors Qn11 or Qn12 coupled therewith concurrently turn on, and the associated row of memory cells are selected from the memory cell array 2.

The bit line pairs BL1 to BLn are respectively associated with the columns of memory cells M11 to Mm1, . . . and M1n to Mmn, and each of the bit line pairs BL1 to BLn is identified by using the column address. Each of the bit line pairs BL1 to BLn consists of first and second bit lines BLa and BLb, and the first bit lines BLa and the second bit lines BLb are respectively coupled with the drain nodes of the n-channel enhancement type switching transistors Qn11 of the memory cell sub-array 2a and with the drain nodes of the n-channel enhancement type switching transistors Qn12 of the memory cell sub-array 2b. The first bit lines BLa are further coupled with the counter electrodes N14 of the storage capacitors Cs12 of the memory cell sub-array 2b, and the second bit lines BLb are further coupled with the counter electrodes N12 of the storage capacitors Cs11 of the memory cell sub-array 2a.

In this instance, each of the bit line pairs BL1 to BLn is split into two halves, and the two halves of each bit line pair are respectively associated with the two memory cell sub-arrays 2a and 2b. Namely, a half of the memory cells in each column is grouped into one of the two memory cell sub-arrays 2a and 2b, and the remaining memory cells, another half of the memory cells in each column, are grouped into the other of the two memory cell sub-arrays 2a and 2b. As a result, the memory cells coupled with one of the two halves of each bit line pair are equal to the memory cells coupled with the other of the two halves of the bit line pair, and, as a result, the parasitic capacitance coupled with one of the two halves is approximately equal to that coupled with the other of the two halves.

The column address decoding unit 3b is coupled with the column selector unit 3c through column address decoded signal lines CD1 to CDy, and the bit line pairs BL1 to BLn are terminated at the column selector unit 3c. The column address decoding unit 3b is responsive to column address predecoded signals indicative of one of the column addresses, and drives one of the column address decoded signal lines CD1 to CDy to an active high voltage level. The column address decoded signal lines CD1 to CDy cause the column selector unit 3c to select one of the bit line pairs BL1 to BLn assigned the selected column address.

The read/write system 4 is operative to read out a data bit from and write a data bit into one of the memory cells M11 to Mmn, and comprises an array of precharge circuits 411 to 41n, an array of sense amplifier circuits 421 to 42n, a data bus 43 and an input/output data unit 44.

The precharge circuits 411 to 41n are respectively associated with the bit line pairs BL1 to BLn, and each of the precharge circuits 411 to 41n consists of a pair of n-channel enhancement type switching transistors Qn13 and Qn14. The n-channel enhancement type switching transistors Qn13 are connected between an intermediate voltage line 6a and the first bit lines BLa of the associated pairs, and the other n-channel enhancement type switching transistors Qn14 are connected between the intermediate voltage line 6a and the second bit lines BLb of the associated pairs. The n-channel enhancement type switching transistors Qn13 and Qn14 are concurrently responsive to a precharge control signal PC, and couple the intermediate voltage line 6a with the first and second bit lines BLa and BLb.

The array of sense amplifier circuits 421 to 42n are respectively associated with the bit line pairs BL1 to BLn, and the sense amplifier circuits have respective sense node pairs N15 and N16 coupled with the bit line pairs BL1 to BLn, respectively. The sense amplifier circuits 421 to 42n are enabled with a sense enable signal SE, and the sense amplifier circuits 421 to 42n increase potential differences on the associated bit line pairs BL1 to BLn.

The data bus 43 couples the column selector unit 3c with the input/output data unit 44, and transfers a potential difference indicative of a write-in data bit or a read-out data bit between the column selector unit 4 and the input/output data unit 44.

The input/output data unit 44 is coupled between a data pin DP and the data bus 43, and produces the potential difference indicative of the write-in data bit from an input data signal and an output data signal from the potential difference indicative of the read-out data bit.

The timing controlling unit 5 is responsive to external control signals and an address transition for sequentially producing internal control signals such as the precharge control signal PC and the sense enable signal SE. The addressing system 3 and the read/write system 4 proceed in a write-in sequence and a read-out sequence under the control of the timing controlling unit 5.

The power supply system 6 distributes a positive power voltage Vcc to the addressing system and the read/write system 4, and an intermediate voltage generator unit 6b is incorporated in the power supply system 6. The intermediate voltage generator unit 6b produces an intermediate voltage Vm at a mid point between the positive power voltage level Vcc and the ground voltage level, and supplies the intermediate voltage level Vm through the intermediate voltage line 6b to the precharge circuits 411 to 41n.

Figure 4:
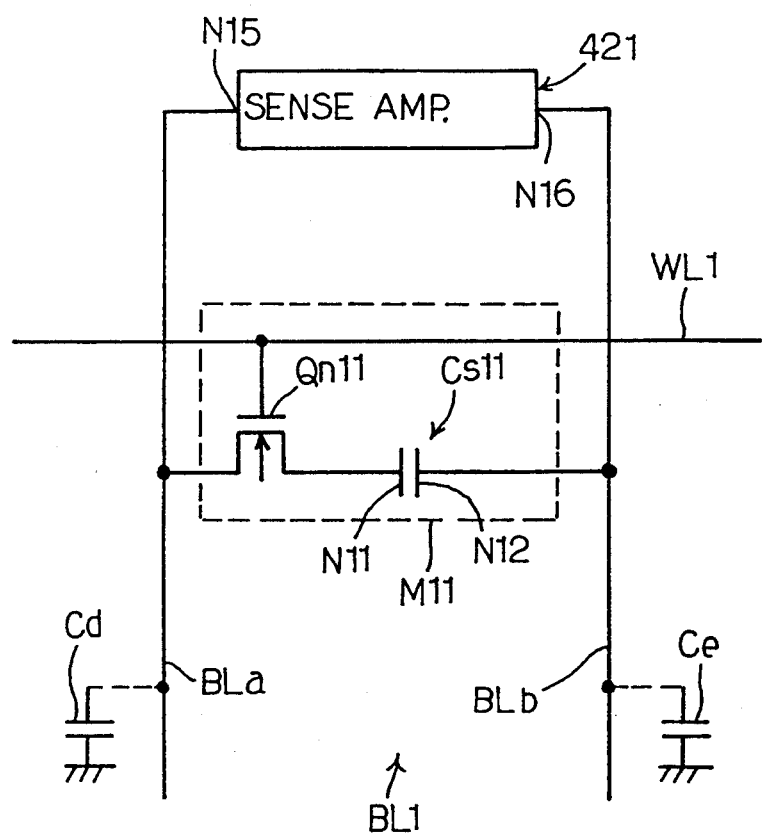
FIG. 4 is a circuit diagram showing a memory cell and an associated sense amplifier circuit extracted from the dynamic random access memory device for analysis.
Figure 5:
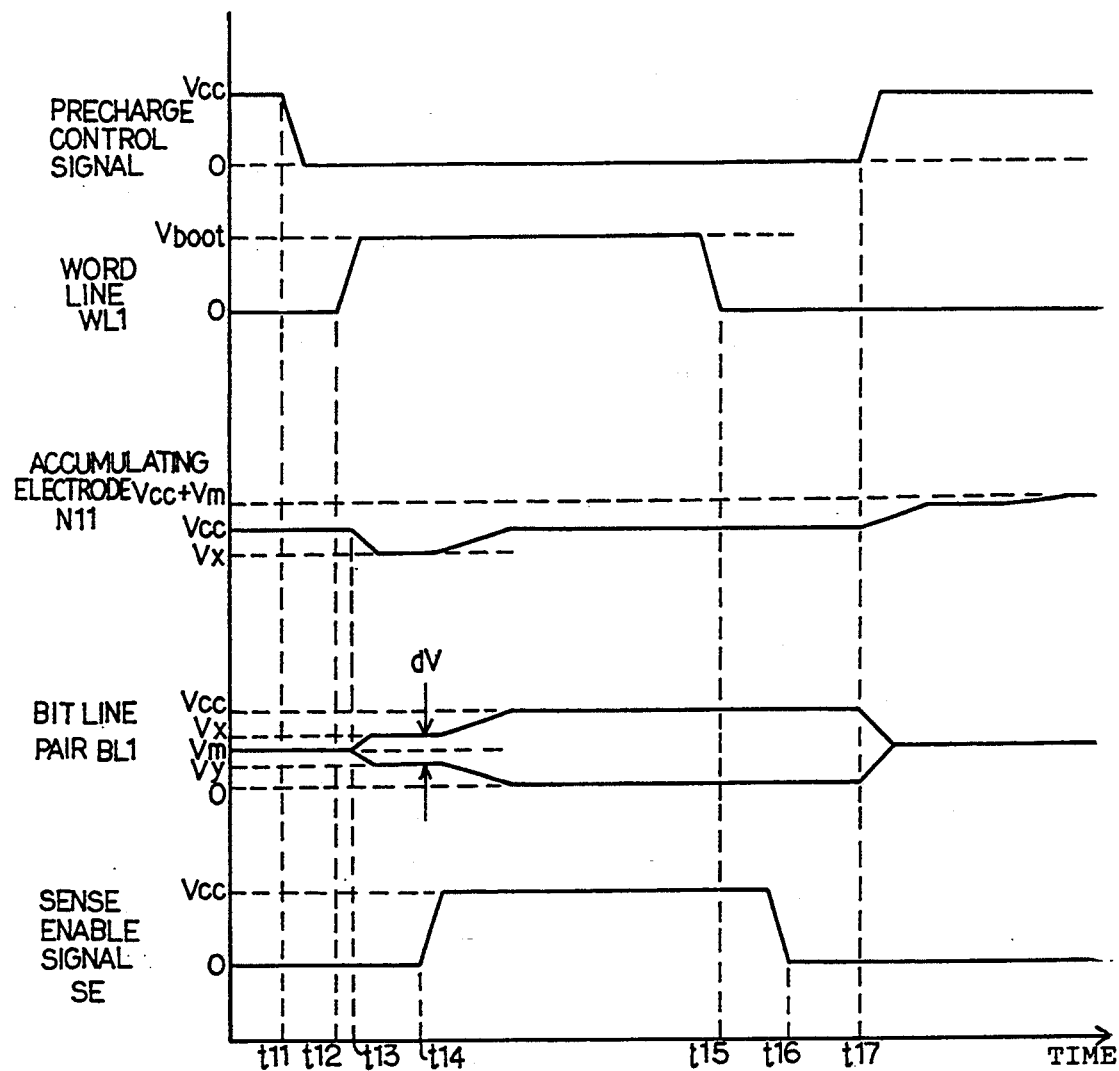
FIG. 5 is a timing chart showing an access to a data bit stored in the dynamic random access memory device.

The read-out sequence is hereinbelow described with reference to FIGS. 4 and 5 on the assumption that the accessed memory cell M11 stores a charge packet indicative of a data bit of logic "1" level. The logic "1" is equivalent to a large amount of electric charge, and can lift the first bit line BLa coupled therewith when the storage capacitor Cs11 is conducted to the first bit line BLa.

Assuming now that an external address signal changes the row address to the word line WL1, the timing controlling unit 5 changes the precharge control signal PC from the active power voltage level Vcc to the inactive ground voltage level at time t11, and isolates the first and second bit lines BLa and BLb already charged to the intermediate voltage level Vm from the intermediate voltage line 6a.

The row address decoder/word line driver unit 3a starts the word line WL1 to go up toward the boosted voltage level Vboot in response to the row address predecoded signals produced from the external address signal at time t12, and the n-channel enhancement type switching transistors Qn11 of the memory cells M11 to M1n turn on so that the accumulating electrodes N11 are conducted to the first bit lines BLa, respectively.

Description is hereinbelow focused on the bit line pair BL1 and the memory cell M11 with reference to FIG. 4. The first bit lines BLa goes up to a certain voltage level Vx, and the second bit line BLb goes down to a voltage level Vy. As a result, a potential difference takes place between the first bit line BLa and the second bit line BLb. The first bit line BLa is balanced with the accumulating electrode N11 at time t13, and the principle of conservation of charge is applicable to calculation of the voltage levels Vx and Vy. If Cd, Ce and Vc are the parasitic capacitance coupled with the first bit line BLa, the parasitic capacitance of the second bit line BLb and the voltage level at the accumulating electrode N11 before conduction to the first bit line BLa, Equations 6 and 7 are established.

$$Cd \times Vm + Cs(Vc - Vm) = Cd \times Vx + Cs(Vx - Vy) \quad (6)$$

$$Ce \times Vm + Cs(Vm - Vc) = Ce \times Vy + Cs(Vy - Vx) \quad (7)$$

where Vm is the precharged level on the first and second bit lines BLa and BLb and Cs is the capacitance of the storage capacitor Cs11.

From Equations 6 and 7, the small potential difference dV is given as follows.

$$dV = Vx - Vy \quad (8)$$
$$= \frac{1}{1 + \frac{Cd \times Ce}{Cs(Cd + Ce)}} (Vc - Vm)$$

If $(Cd \times Ce)/(Cd + Ce)$ is minimized, the potential difference dV is maximized, then the conditions of the maximum potential difference dV is Cd=Ce in Inequality 9.

$$\frac{Cd \times Ce}{Cd + Ce} \frac{Cd \times Ce}{(\sqrt{Cd} - \sqrt{Ce})^2 + 2\sqrt{Cd\,Ce}} \geq \frac{1}{2} Cd \quad (9)$$

In this instance, each of the bit line pairs BL1 to BLn is split into the two halves, and the parasitic capacitances Cd and Ce are equal to each other. As a result, the potential difference dV is maximized, and is expressed by Equation 10

$$dV = \frac{1}{1 + \frac{1}{2} \frac{Cd}{Cs}} (Vs - Vm) \quad (10)$$

where Vs is the voltage level at the accumulating electrode N11 before conducting to the bit line BLa. The sense enable signal SE starts rising toward the power voltage level Vcc at time t14, and the sense amplifier circuits 421 to 42n begin to increase the potential differences on the associated bit line pairs BL1 to BLn. The first and second bit lines BLa and BLb of the bit line pair BL1 respectively move toward the positive power voltage level Vcc and the ground voltage level.

The word line WL1 skill remains at the boosted voltage level Vboot, and, for this reason, the voltage levels on the first bit lines BLa are restored in the respective storage capacitors Cs11. The first bit line BLa of the bit line pair BL1 is lifted to the positive power voltage level Vcc through the sense amplification, and the positive power voltage level Vcc on the first bit line BLa is restored in the accumulating electrode N11 of the storage capacitor Cs11 of the memory cell M11.

The word line WL1 is recovered from the boosted voltage level Vboot to the ground voltage level at time t15, and the accumulating electrodes N11 of the memory cells M11 to M1n are electrically isolated from the first bit lines BLa.

The sense enable signal SE goes down to the inactive ground voltage level at time t16, and the sense amplifier circuits 421 to 42n isolate the bit line pairs BL1 to BLn from the positive power voltage line and the ground voltage line.

The precharge control signal PC starts rising toward the positive power voltage level Vcc at time t17, and the first and second bit lines BLa and BLb are electrically conducted to the intermediate voltage line 6a.

The principle of conservation of charge is applicable to a boosted voltage level Vz at the accumulating electrode N11 of the storage capacitor Cs11 again, and Equation 11 is established.

$$Cs(Vcc-0)=Cs(Vz-Vm) \quad (11)$$

From Equation 11, the boosted voltage level Vz is given as $$Vz=Vcc+Vm \quad (12)$$

Even if the accumulating electrode N11 is charged to the positive power voltage level Vcc, the boosted voltage level Vz is restored in the accumulating electrode N11, and the memory cell M11 produces a large potential difference dV' between the associated bit lines BLa and BLb in the next access. The large potential difference dV' is given as $$dV' = \frac{1}{1 + \frac{1}{2}\frac{Cd}{Cs}} Vcc \quad (13)$$

Figure 1:
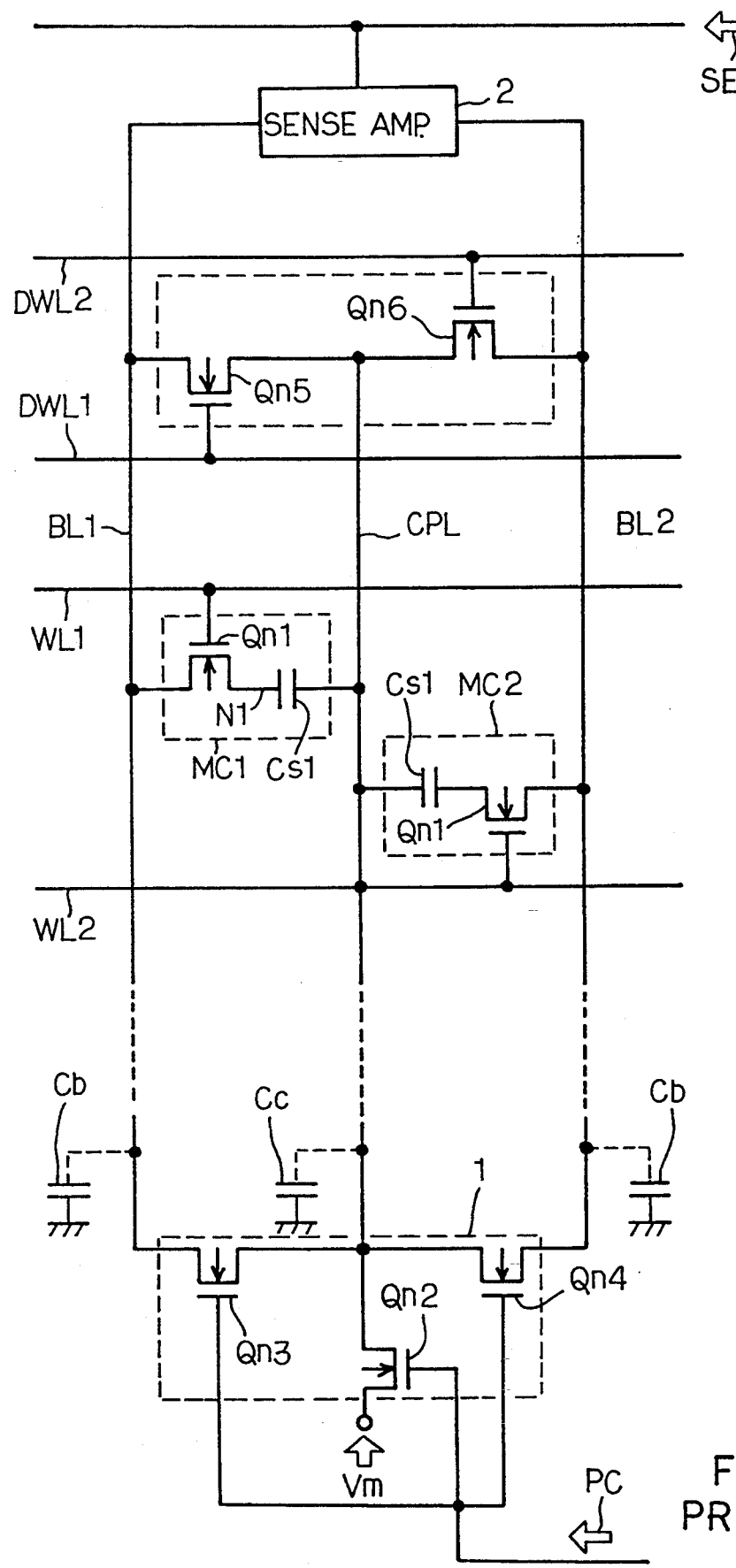
FIG. 1 is a circuit diagram showing the arrangement of the prior art dynamic random access memory device.
Figure 2:
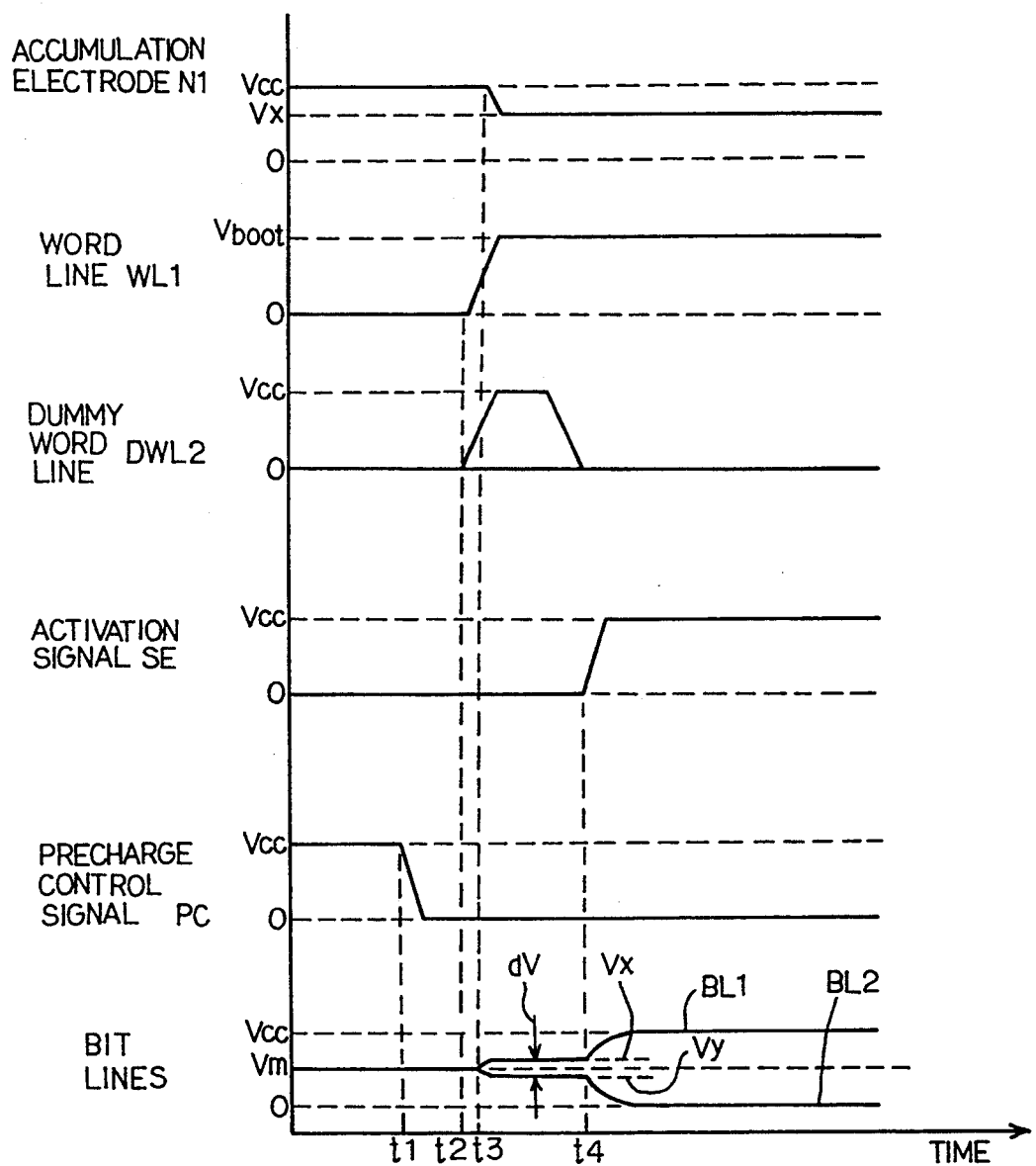
FIG. 2 is a timing chart showing the essential signals of the prior art dynamic random access memory device.

If the dynamic random access memory device shown in FIG. 3 is accessed under the same conditions as the prior art dummy word line system shown in FIG. 1, the parasitic capacitance Cd should be assumed to be Cb+Cc/2, and Equation 13 is rewritten as $$dV' = \frac{1}{1 + \frac{1}{2}\left(\frac{Cb}{Cs} + \frac{1}{2}\frac{Cc}{Cs}\right)} Vcc \quad (14)$$

Using A and B as similar to Equation 3, Equation 14 is rewritten as $$dV' = \frac{1}{1 + \frac{1}{2}\left(A + \frac{1}{2}\frac{A}{B}\right)} Vcc \quad (15)$$

Assuming that A and B are 10 and 3, the prior art dummy word line system merely produces a potential difference of 0.07 Vcc. However, each of the memory cells M11 to Mmn shown in FIG. 3 produces the potential difference dV' of 0.17 Vcc, and prevents the sense amplifier circuits 421 to 42n from malfunction due to small margin.

In this instance, first, second, third, fourth, fifth and sixth timings are given at times t11, t12, t14, t15, t16 and t17, respectively.

As will be appreciated from the foregoing description, the dynamic random access memory device does not need any dummy word lines nor cell plate lines, and the circuit arrangement is simpler than the prior art dynamic random access memory device. Moreover, the memory cells M11 to Mmn directly coupled between first-and second bit lines BLa and BLb effectively increase the restore level at the accumulating electrodes N11, and keep large margin for the sense amplifier circuits 421 to 42n.

Second Embodiment

Figure 6:
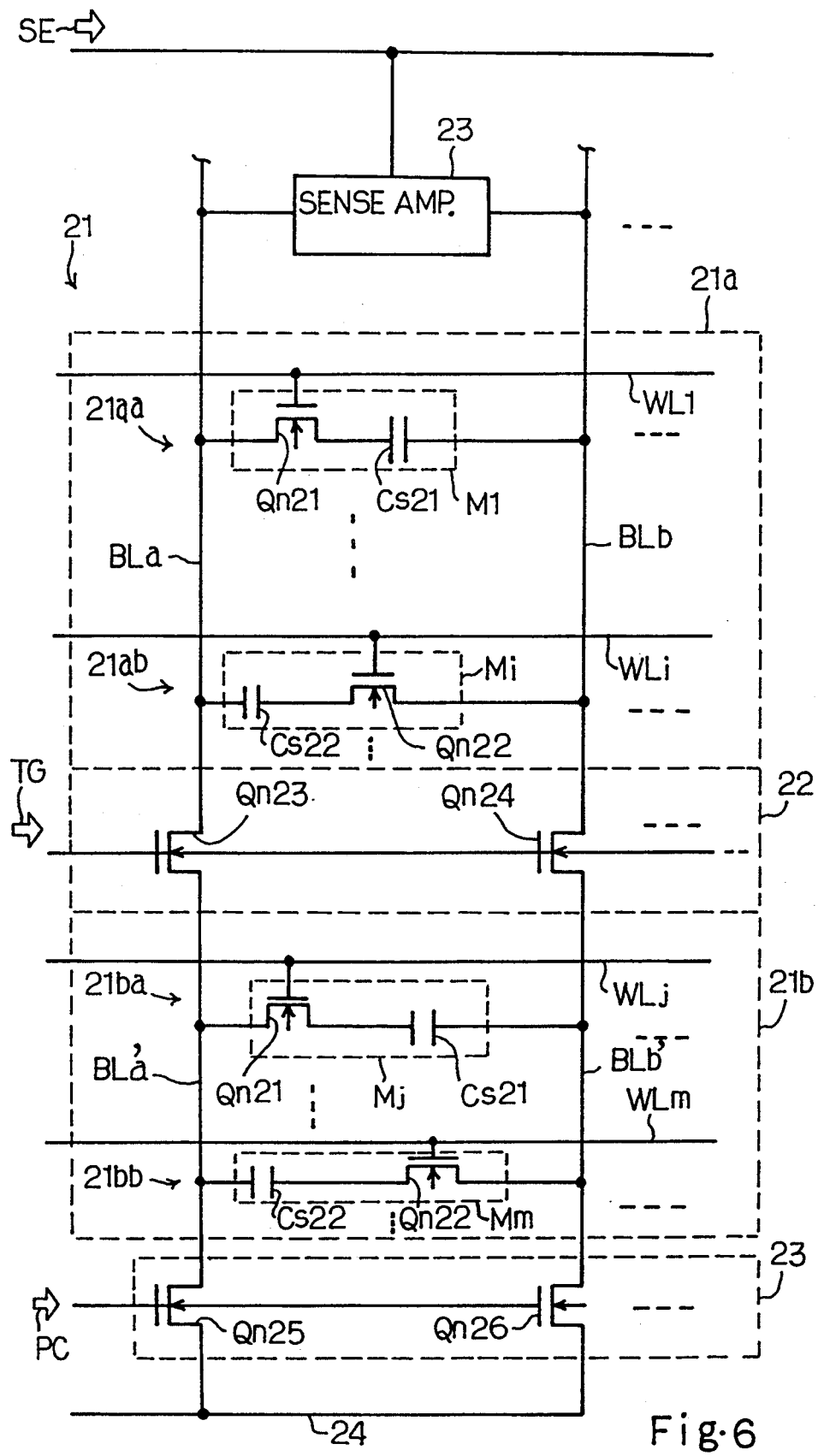
FIG. 6 is a circuit diagram showing the arrangement of another dynamic random access memory device according to the present invention.

Turning to FIG. 6 of the drawings, a column of memory cells M1 to Mi and Mj to Mm incorporated in another dynamic random access memory device is coupled with first and second bit lines BLa and BLb. Although columns of memory cells are incorporated in the memory cell array 21 as similar to the first embodiment, only one column of memory cells M1 to Mm and associated circuits are illustrated in FIG. 6 for the sake of simplicity.

The column of memory cells M1 to Mm is broken down into a first memory cell array 21a and a second memory cell array 21b, and the bit line pairs BLa/BLb BLa'/BLb' are respectively coupled with the first memory cell array 21a and the second memory cell array 21b.

The bit line pair BLa/BLb has a first section associated with a first memory cell block 21aa and a second section associated with a second memory cell block 21ab, and the bit line pair BLa'/BLb' also has a first section associated with a first memory cell block 21ba and a second section associated with a second memory cell block 21bb.

Each of the memory cells M1, ... and Mj, ... incorporated in the first memory cell blocks 21aa and 21ba is implemented by a series combination of an n-channel enhancement type switching transistor Qn21 and a storage capacitor Cs21, and the drain node of the switching transistor Qn21 and the counter electrode of the capacitor Cs21 are respectively coupled with the first bit line BLa or BLa' and the second bit line BLb or BLb'.

Each of the memory cells Mi, ... and Mm, ... incorporated in the second memory cell blocks 21ab and 21bb is also implemented by a series combination of an n-channel enhancement type switching transistor Qn22 and a storage capacitor Cs22. However, the drain node of the switching transistor Qn22 and the counter electrode of the capacitor Cs22 are respectively coupled with the second bit line BLb or BLb' and the first bit line BLa or BLa'.

Word lines WL1, ... WLi,.. and word lines WLj, .. ., WLm, ... are respectively connected with the gate electrodes of the n-channel enhancement type switching transistors Qn21 and Qn22, and a row address decoder/word line driver unit (not shown) selectively energizes the word lines WL1, ... , WLm, ...

The transfer gate unit 22 comprises n-channel enhancement type switching transistors Qn23 and Qn24, and are connected between the bit line pair BLa/BLb and the bit line pair BLa'/BLb'. The n-channel enhancement type switching transistors Qn23 and Qn24 are responsive to a gate control signal TG, and are concurrently switched on and off. In detail, if the row address decoder/word line driver unit selects one of the word lines WL1, ... , WLi ... , the gate control signal TG is changed to a ground voltage level, and the bit line pair BLa/BLb is isolated from the other bit line pair BLa'/BLb'. On the other hand, when one of the word lines WLj, ... , WLm ... is energized, the gate control signal TG goes up to a high voltage level, and the bit line pair BLa'/BLb' is conducted to the bit line pair BLa/BLb.

A precharging unit 23 is further incorporated in the dynamic random access memory device, and comprises n-channel enhancement type switching transistors Qn25 and Qn26 coupled between an intermediate voltage line 24 and the bit line pair BLa'/BLb'. The n-channel enhancement type switching transistors Qn25 and Qn26 are responsive to a precharge control signal PC, and allow the bit lines BLa' and BLb' to be charged to the intermediate voltage level Vm. While the precharging unit 23 is charging the bit lines BLa'and BLb', the transfer gate unit 22 conducts the bit line pair BLa'/BLb' to the bit line pair BLa/BLb, and the bit line pair BLa/BLb is also charged to the intermediate voltage level Vm.

A sense amplifier unit 23 is coupled with the bit line pair BLa/BLb, and is responsive to a sense enable signal SE for increasing a potential difference between the bit lines BLa and BLb. If one of the memory cells of the second memory cell array 21b is accessed, the transfer gate unit 22 continuously conducts the bit line pair BLa'/BLb' to the bit line pair BLa/BLb, and the potential difference on the bit line pair BLa'/BLb' is transferred through the transfer gate unit 22 and the bit line pair BLa/BLb to the sense amplifier unit 23.

On the other hand, if one of the memory cells of the first memory cell array 21a is accessed, the transfer gate unit 22 isolates the bit line pair BLa/BLb from the other bit line pair BLa'/BLb' after the precharging, and the bit line pair BLa/BLb propagates the potential difference to the sense amplifier unit 23.

The total length of the bit line pairs BLa/BLb and BLa'/BLb' is assumed to be equal to the bit line pair BLa/BLb of the first embodiment, and the transfer gate unit 22 decreases the parasitic capacitance coupled to each bit line of the bit line pair BLa/BLb to a half of the parasitic capacitance coupled with each bit line BLa or BLb of the first embodiment. As a result, the potential difference dV" supplied to the sense amplifier unit 23 is calculated as $$dV'' = \frac{1}{1 + \frac{1}{2}\left\{\frac{Cb/2}{Cs} + \frac{1}{2}\frac{Cc/4}{Cs}\right\}} Vcc \qquad (16)$$

Comparing Equation 16 with Equation 14, it is understood that the potential difference dV" is larger than the potential difference dV', and the margin for the sense amplifier unit 23 is much larger than that of the prior art dynamic random access memory device. Thus, the transfer gate unit 22 of the second embodiment effectively increases the potential difference, and does not allow a malfunction of the sense amplifier unit 23 to take place.

Although particular embodiments of the present invention have been shown and described, it will be obvious to those skilled in the art that various changes and modifications may be made without departing from the spirit and scope of the present invention. For example, a dynamic random access memory device may have a plurality of memory cell arrays each analogous to the memory cell array 2, and the drain nodes of the n-channel enhancement type switching transistors of each column may be alternately coupled with the first and second bit lines.

What is claimed is:

1. A dynamic random access memory device comprising:
    a) a memory cell array including a plurality of addressable memory cells having respective switching transistors and respective storage capacitors respectively connected in series with said switching transistors;
    b) a plurality of word lines selectively connected with control gates of said switching transistors for selecting memory cells from said memory cell-array;
    c) a plurality of bit line pairs selectively coupled with said plurality of addressable memory cells for producing potential differences indicative of data bits read out from the memory cells selected from said memory cell array, each of said plurality of bit line pairs consisting of a first bit line and a second bit line, memory cells associated with each bit line pair being grouped into a first memory cell block and a second memory cell block, the switching transistors and the associated storage capacitors of the first memory cell block being connected with said first bit line and said second bit line of the associated bit line pair, respectively, the switching transistors and the associated storage capacitors of the second memory cell block being connected with said second bit line and said first bit line of said associated bit line pair, respectively; and
    d) a read/write system associated with said plurality of bit line pairs, and operative to read and write at least one data bit from and into said memory cell array.

2. The dynamic random access memory device as set forth in claim 1, in which each of said plurality of bit line pair has a first section associated with said first memory cell block and a second section associated with said second memory cell block, a parasitic capacitance coupled with said first section being approximately equal to a parasitic capacitance coupled with said second section.

3. The dynamic random access memory device as set forth in claim 1, in which the memory cells forming said first memory cell block is equal to the memory cells forming said second memory cell block.

4. A dynamic random access memory device comprising:
    a) a memory cell array including a plurality of addressable memory cells having respective switching transistors and respective storage capacitors respectively connected in series with said switching transistors;
    b) a plurality of word lines selectively connected with control gates of said switching transistors for selecting memory cells from said memory cell array;
    c) a plurality of bit line pairs selectively coupled with said plurality of addressable memory cells for producing potential differences indicative of data bits read out from the memory cells selected from said memory cell array, each of said plurality of bit line pairs consisting of a first bit line and a second bit line, memory cells associated with each bit line pair being group into a first memory cell block and a second memory cell block, the switching transistors and the associated storage capacitors of the first memory cell block being connected with said first bit line and said second bit line of the associated bit line pair, respectively, the switching transistors and the associated storage capacitors of the second memory cell block being connected with said second bit line and said first bit line of said associated bit line pair, respectively; and
    d) a read/write system associated with said plurality of bit line pairs, and operative to read and write at least one data bit from and into said memory cell array,
    said read/write system comprising
        d-1) a precharging unit coupled with said plurality of bit line pairs for charging to an intermediate voltage; and
        d-2) a plurality of sense amplifier circuits respectively associated with said plurality of bit line pairs, and operative to increase potential differences on the associated bit line pairs.

5. The dynamic random access memory device as set forth in claim 4, in which further comprises
    e) a timing controlling unit for supplying a precharge control signal and a sense enable signal to said precharging unit and said plurality of sense amplifier circuits, respectively, said precharge control signal isolating said plurality of bit line pairs from a source of said intermediate voltage at a first timing, one of said plurality of word lines being energized at a second timing after said first timing for allowing the switching transistors coupled therewith to turn on, said sense enable signal activating said plurality of sense amplifier circuits at a third timing after said second timing, said one of said plurality of word lines causing said switching transistors to turn off at a fourth timing after said third timing, said sense enable signal deactivating said plurality of sense amplifier circuits at a fifth timing after said fourth timing, said precharge control signal conducting said source of said intermediate voltage to said plurality of bit line pairs at a sixth timing after said fifth timing for increasing voltage levels at accumulating electrodes of the storage capacitors of the memory cells coupled with said one of said plurality of word lines.

6. A dynamic random access memory device comprising:
   a) a memory cell array including a plurality of addressable memory cells having respective switching transistors and respective storage capacitors respectively connected in series with said switching transistors;
   b) a plurality of word lines selectively connected with control gates of said switching transistors for selecting memory cells from said memory cell array;
   c) a plurality of bit line pairs selectively coupled with said plurality of addressable memory cells for producing potential differences indicative of data bits read out from the memory cells selected from said memory cell array, each of said plurality of bit line pairs consisting of a first bit line and a second bit line, memory cells associated with each bit line pair being grouped into a first memory cell block and a second memory cell block, the switching transistors and the associated storage capacitors of the first memory cell block being connected with said first bit line and said second bit line of the associated bit line pair, respectively, the switching transistors and the associated storage capacitors of the second memory cell block being connected with said second bit line and said first bit line of said associated bit line pair, respectively;
   d) read/write system associated with said plurality of bit line pairs, and operative to read and write at least one data bit from and into said memory cell array;
   e) another memory cell array including a plurality of other addressable memory cells having respective other switching transistors and respective other storage capacitors respectively connected in series with said other switching transistors;
   f) a plurality of other word lines selectively connected with control gates of said other switching transistors for selecting other memory cells from said another memory cell array;
   g) a plurality of other bit line pairs selectively coupled with said plurality of other addressable memory cells for producing potential differences indicative of data bits read out from the other memory cells selected from said another memory cell array, each of said plurality of other bit line pairs consisting of a third bit line and a fourth bit line, other memory cells associated with each of said plurality of other bit line pairs being grouped into a third memory cell block and a fourth memory cell block, the other switching transistors and the associated other storage capacitors of the third memory cell block being connected with said third bit line and said fourth bit line of the associated other bit line pair, respectively, the other switching transistors and the associated other storage capacitors of the fourth memory cell block being connected with said fourth bit line and said third bit line of said associated other bit line pair, respectively; and
   h) a transfer gate unit coupled between said plurality of bit line pairs and said plurality of other bit line pairs, said transfer gate unit conducting said plurality of bit line pairs to said plurality of other bit line pairs when data information stored in said another memory cell array is accessed, said transfer gate unit isolating said plurality of bit line pairs from said plurality of other bit line pairs when data information stored in said memory cell array is accessed.

7. A dynamic random access memory device fabricated on a semiconductor chip, comprising:
   a) a memory cell array including a plurality of memory cells arranged in rows and columns and having respective switching transistors and respective storage capacitors connected in series with said switching transistors, respectively, each column of memory cells being divided into a first memory cell block and a second memory cell block;
   b) a plurality of word lines respectively associated with said rows of memory cells, and coupled with gate electrodes of said switching transistors of the associated rows;
   c) a plurality of bit line pairs respectively associated with said columns of memory cells, and having respective first bit lines and respective second bit lines, one of said plurality of bit line pairs being divided into a first section and a second section, drain nodes of the switching transistors and counter electrodes of the storage capacitors incorporated in said first memory cell block being connected with the first bit line and the second bit line of said first section, drain nodes of the switching transistors and counter electrodes of the storage capacitors incorporated in said second memory cell block being connected with the second bit line and the first bit line of said second section;
   d) a precharging unit connected with said plurality of bit line pairs, and operative to charge said plurality of bit line pairs to an intermediate voltage level between a high voltage level and a low voltage level;
   e) a plurality of sense amplifier circuits respectively connected with said plurality of bit line pairs, and operative to increase potential differences on said plurality of bit line pairs; and
   f) a timing controlling unit producing a precharge control signal supplied to said precharging unit and a sense enable signal supplied to said plurality of sense amplifier circuits, said precharge control signal isolating said plurality of bit line pairs from a source of said intermediate voltage at a first timing, one of said plurality of word lines being energized at a second timing after said first timing for allowing the switching transistors of the associated row to turn on, said sense enable signal activating said plurality of sense amplifier circuits at a third timing after said second timing, said one of said plurality of word lines causing said switching transistors to turn off at a fourth timing after said third timing, said sense enable signal deactivating said plurality of sense amplifier circuits at a fifth timing after said fourth timing, said precharge control signal conducting said source of said intermediate voltage level to said plurality of bit line pairs at a sixth timing after said fifth timing for increasing voltage levels at accumulating electrodes of the storage capacitors of the memory cells coupled with said one of said plurality of word lines.

* * * * *